(12) United States Patent
Kapusta et al.

(10) Patent No.: US 9,024,447 B2
(45) Date of Patent: May 5, 2015

(54) STACKABLE ELECTRONIC PACKAGE AND METHOD OF MAKING SAME

(75) Inventors: Christopher James Kapusta, Delanson, NY (US); James Sabatini, Scotia, NY (US)

(73) Assignee: General Electric Company, Schenectady, NY (US)

( * ) Notice: Subject to any disclaimer, the term of this patent is extended or adjusted under 35 U.S.C. 154(b) by 5 days.

(21) Appl. No.: 13/418,492

(22) Filed: Mar. 13, 2012

(65) Prior Publication Data

US 2012/0168941 A1     Jul. 5, 2012

Related U.S. Application Data

(63) Continuation of application No. 12/410,281, filed on Mar. 24, 2009, now Pat. No. 8,163,596.

(51) Int. Cl.
*H01L 23/48* (2006.01)
*H01L 23/498* (2006.01)
*H01L 23/538* (2006.01)
*H01L 23/00* (2006.01)
(Continued)

(52) U.S. Cl.
CPC ......... *H01L 23/4985* (2013.01); *H01L 23/3128* (2013.01); *H01L 23/49827* (2013.01); *H01L 23/5389* (2013.01); *H01L 24/18* (2013.01); *H01L 24/82* (2013.01); *H01L 25/105* (2013.01); *H01L 2224/18* (2013.01); *H01L 2224/92144* (2013.01); *H01L 2924/01029* (2013.01); *H01L 2924/01042* (2013.01); *H01L 2924/01075* (2013.01); *H01L 2924/01078* (2013.01); *H01L 2924/01079* (2013.01); *H01L 2924/01082* (2013.01); *H01L 2924/14* (2013.01); *H01L 2924/18162* (2013.01); *H01L 2924/3025* (2013.01); *H01L 2924/01006* (2013.01); *H01L 2924/01024* (2013.01); *H01L 2924/01033* (2013.01); *H01L 2924/01047* (2013.01); *H01L 2924/014* (2013.01); *H01L 2225/1035* (2013.01); *H01L 2225/1058* (2013.01)

(58) Field of Classification Search
CPC .................................................... H01L 23/481
USPC ..................... 257/737, 773, E23.07, E21.502
See application file for complete search history.

(56) References Cited

U.S. PATENT DOCUMENTS

| | | |
|---|---|---|
| 3,942,245 A | 3/1976 | Jackson et al. |
| 4,783,695 A | 11/1988 | Eichelberger et al. |
| 5,324,687 A | 6/1994 | Wojnarowski |

(Continued)

OTHER PUBLICATIONS

Forman et al., "Development of GE's Plastic Thin-Zero Outline Package (TZOP) Technology," IEEE Xplore, 1995, pp. 664-668.

(Continued)

*Primary Examiner* — Elias M Ullah
(74) *Attorney, Agent, or Firm* — Ziolkowski Patent Solutions Group, SC; Jean K. Testa

(57) ABSTRACT

An apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

20 Claims, 6 Drawing Sheets

(51) Int. Cl.
*H01L 25/10* (2006.01)
*H01L 23/31* (2006.01)

(56) References Cited

U.S. PATENT DOCUMENTS

| | | | |
|---|---|---|---|
| 5,373,627 A | | 12/1994 | Grebe |
| 5,731,066 A | * | 3/1998 | Ando et al. .................. 428/210 |
| 5,973,393 A | | 10/1999 | Chia et al. |
| 6,255,137 B1 | | 7/2001 | Gorczyca et al. |
| 6,284,564 B1 | | 9/2001 | Balch et al. |
| 6,294,741 B1 | | 9/2001 | Cole, Jr. et al. |
| 6,602,739 B1 | | 8/2003 | Rose et al. |
| 6,847,109 B2 | | 1/2005 | Shim |
| 7,352,052 B2 | | 4/2008 | Imoto et al. |
| 7,361,533 B1 | | 4/2008 | Huemoeller et al. |
| 7,548,430 B1 | | 6/2009 | Huemoeller et al. |
| 7,777,351 B1 | | 8/2010 | Berry et al. |
| 7,791,206 B2 | | 9/2010 | Takeuchi et al. |
| 7,851,259 B2 | | 12/2010 | Kim |
| 2003/0006494 A1 | | 1/2003 | Lee et al. |
| 2005/0253247 A1 | * | 11/2005 | Imoto et al. .................. 257/700 |
| 2007/0018313 A1 | * | 1/2007 | Gomyo et al. ................ 257/723 |
| 2010/0171891 A1 | * | 7/2010 | Kaji et al. ...................... 349/12 |

OTHER PUBLICATIONS

Fillion et al., "Reliability Evaluation of Chip-on-Flex CSP Devices," 1998 international Conference on Multichip Modules and High Density Packaging, IEEE Xplore, 1998, pp. 242-246.

Package on Package (PoP) Family, Amkor Technology, http://www.amkor.com/go/packaging/all-packages/psvfbga/psvfbga-package-stackable-ver . . . .

High Density Interconnect Technology, General Electric, Inc., Hanover, MD, 1999, http://www.mdatechnology.net/techprofile.aspx?id=439.

* cited by examiner

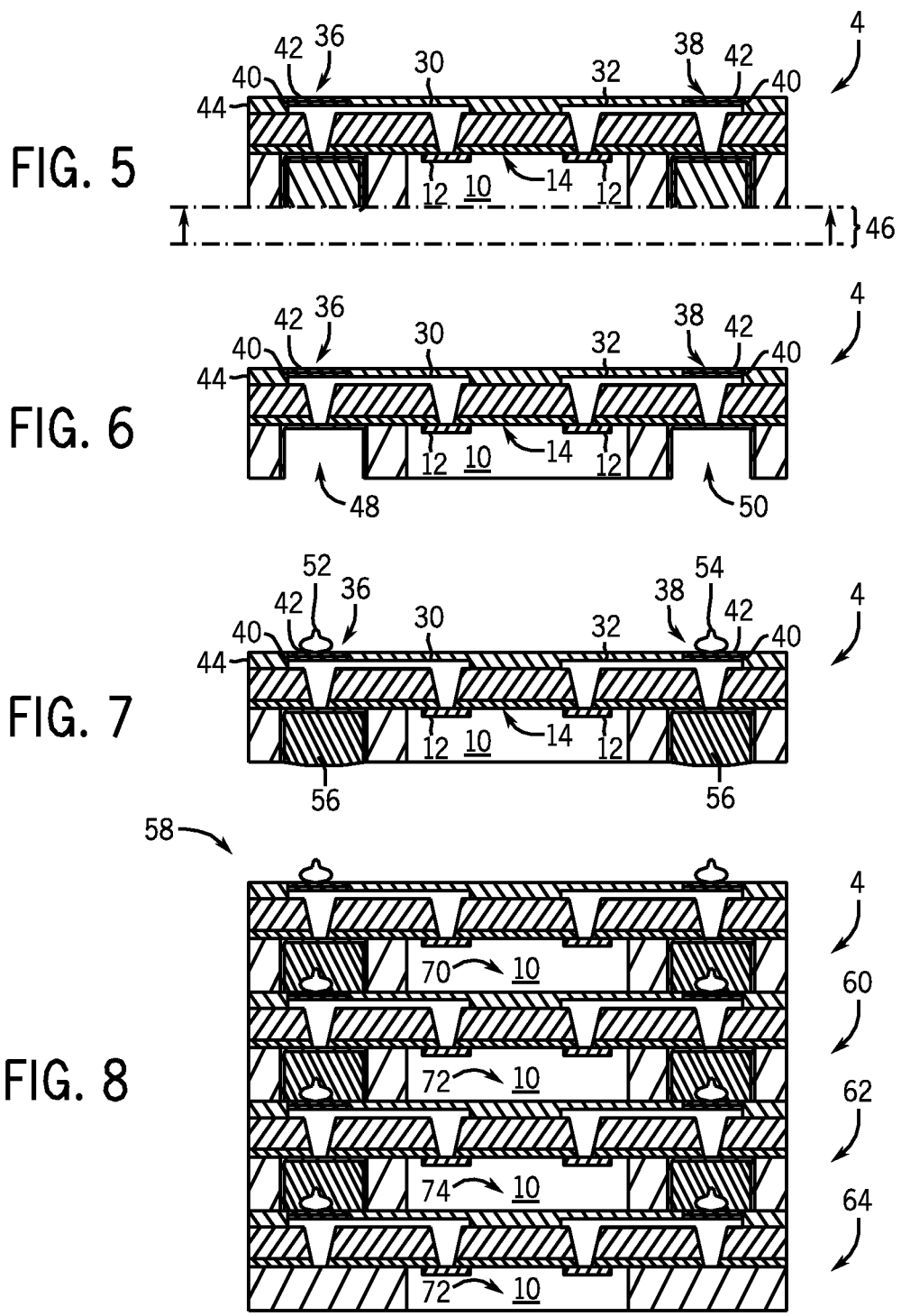

STACKABLE ELECTRONIC PACKAGE AND METHOD OF MAKING SAME

CROSS-REFERENCE TO RELATED APPLICATION

The present application is a continuation of and claims priority to U.S. patent application Ser. No. 12/410,281 filed Mar. 24, 2009, the disclosure of which is incorporated herein.

GOVERNMENT RIGHTS IN THE INVENTION

The U.S. Government has a paid-up license in this invention and the right in limited circumstances to require the patent owner to license others on reasonable terms as provided for by the terms of Government Contract No. FA9453-04-C-0003 awarded by the Air Force Research Laboratory.

BACKGROUND OF THE INVENTION

The invention relates generally to integrated circuit packages and, more particularly, to an apparatus and method of fabricating a package having a reduced stacking height thereof.

Integrated circuit (IC) packages are typically fabricated having a number of embedded silicon devices such as memory chips, microprocessors, translation circuitry, buffering, switching, and the like. In order to combine and increase functionality of an IC, it is often desirable to stack and interconnect various die types into a single device or package. Thus, embedded chip packages can be manufactured having a plurality of chips or electronic components in a stacked 3D arrangement. The plurality of chips or electronic components are electrically connected to an input/output system by way of metal interconnects routed through a plurality of laminate re-distribution layers.

Advancements in IC packaging requirements pose challenges to the existing embedded chip build-up process. That is, it is desired in many current embedded chip packages to have an increased number of re-distribution layers, with eight or more re-distribution layers being common. The advancements are driven by ever-increasing needs for achieving better performance, greater miniaturization, and higher reliability. New packaging technology also has to further provide for the possibilities of batch production for the purpose of large-scale manufacturing thereby allowing economy of scale. Thus, as ICs become increasingly smaller and yield better operating performance, packaging technology has correspondingly evolved from leaded packaging, to laminate-based ball grid array (BGA) packaging, to chip-scale packaging (CSP), to flipchip packages, and to embedded chip build-up packaging.

There are a variety of known methods for stacking die to form a stacked package. One method includes stacking on the wafer level. In this approach, the dies are kept in wafer format and are stacked on top of each other and bonded together at high temperatures. Typically the layer-layer connections are formed by thru silicon vias. However, this method limits the mixing of die types that can be intermixed in the IC package. Another method is by stacking on the individual die level. Typically this method includes mounting a single die to a lead frame chip carrier interconnect platform and additional dies are then glued and stacked on top of each other. The interconnect is then formed by wirebonding to the exposed pads of the stacked die and to an I/O of the lead frame. However, this arrangement also limits the use of die types to those having perimeter connections and pyramid die stacking.

Furthermore, these stacking methods typically result in an unacceptably thick package height. In order to handle and process the die (in either wafer format or as individual die), each must be typically 250 microns or greater in thickness. Thus, when in final package form, an 8-layer structure, for example, may be 2 mm or more in thickness. Such a package may be cumbersome to work with, expensive to fabricate and process, and may be fragile to handle for subsequent processing and usage. Also, such limitations may limit the overall number of layers in the final package if there is a restrictive total package thickness for the final application, thus limiting the functionality and performance.

Additionally, a laser ablation process may be used to form cavities in the overmold/encapsulant of molded chip scale packages. However, control of the laser to ablate to a certain depth within the encapsulant is difficult, and damage to an underlying material may occur when performed on thinner materials. Also, side wall profiles of laser-drilled openings can be very irregular.

Accordingly there is a need for a method for embedded chip fabrication that allows for the application of multiple dies and die types in a stacked arrangement with a reduced overall stack height. There is a further need for embedded chip fabrication that allows for the application of multiple re-distribution layers and thinner package heights.

It would therefore be desirable to have a system and method capable of processing and fabricating a stacked IC package having a reduced package thickness.

BRIEF DESCRIPTION OF THE INVENTION

The invention provides a system and method of processing and fabricating a stacked IC package having a reduced package thickness.

In accordance with one aspect of the invention, an apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

In accordance with another aspect of the invention, a method comprises forming a first chip apparatus. Forming the first chip apparatus comprises coupling a first die and a first plurality of feed-thru pads to a first side of a first flex layer, the first die comprising a plurality of electrical pads; and coupling a first plurality of slugs to the first plurality of feed-thru pads. Forming the first chip apparatus also comprises encapsulating the first die, the first plurality of feed-thru pads, and the first plurality of slugs in a first encapsulant; and removing a portion of the first encapsulant to expose the first plurality of slugs. Forming the first chip apparatus further comprises removing the first plurality of slugs from the first encapsulant to form a first plurality of cavities in the first encapsulant, to expose a portion of the first plurality of feed-thru pads coupled to the first side of the first flex layer, and to reduce a rigidity of the first portion of the first plurality of feed-thru pads.

In accordance with yet another aspect of the invention, a method comprises forming a first chip package layer that comprises coupling a first die to a first flex layer, coupling a first plurality of feed-thru pads to the first flex layer, and coupling a first plurality of sacrificial material bodies to the first plurality of feed-thru pads. Forming the first chip package layer also comprises applying a first encapsulant to the first flex layer, to the first die, to the first plurality of feed-thru pads, and to the first plurality of sacrificial material bodies. Forming the first chip package layer further comprises curing the first encapsulant, grinding a portion of the encapsulant to reveal the first plurality of sacrificial material bodies, and expunging the first plurality of sacrificial material bodies from the encapsulant to create a plurality of chambers in the encapsulant and to reveal the first plurality of feed-thru pads.

BRIEF DESCRIPTION OF THE DRAWINGS

The drawings illustrate one preferred embodiment presently contemplated for carrying out the invention.

In the drawings:

FIGS. 1-8 are schematic block diagrams showing steps of making a chip scale package incorporating in accordance with an embodiment of the invention.

DETAILED DESCRIPTION

Figure 1:
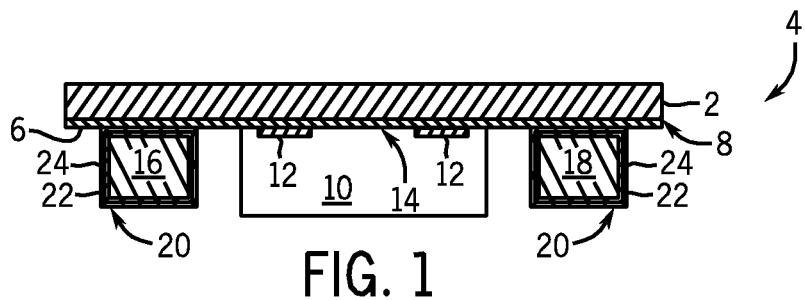

FIGS. 1-8 are schematic block diagrams showing steps of making a stackable chip scale package having multiple chip scale package layers in accordance with an embodiment of the invention. FIG. 1 shows a flex material 2 of a first chip scale package layer 4 having a layer of adhesive 6 applied to a first side 8 thereof. In one embodiment, flex material 2 is formed of a dielectric material such as Kapton. A semiconductor die 10 having a plurality of contact pads 12 attached to an active surface 14 thereof is coupled or attached to first side 8 of flex material 2 via adhesive layer 6. In one embodiment, die 10 is placed into adhesive layer 6 using conventional pick and place equipment and methods. While FIG. 1 shows a die attached the flex material, in another embodiment of the invention, an electronic component 10 other than a die such as an active or passive electronic device may be attached to flex material 2. Additionally, it is contemplated that a plurality of electronic components 10 may be attached to flex material 2 such that a multi-component module or layer may be formed.

Still referring to FIG. 1, a pair of slugs or sacrificial materials 16, 18 are also coupled to first side 8 of flex material 2 via adhesive layer 6. Slugs 16, 18 are formed of a material allowing for the removal or dissolution of the slug 16, 18 via an etchant. In one embodiment, slugs 16, 18 are formed of a copper/molybdenum combination material that may be etched via ferric chloride. Slugs 16, 18 have a multi-layer coating 20 applied thereto comprising a layer of nickel 22 coating the slug material and a layer of gold 24 coating the layer of nickel 22. In one embodiment, the multi-layer coating 20 coats the entire slug 16, 18 as shown. However, the entire slug 16, 18 need not be coated. It is contemplated that at least the side of the slug 16, 18 facing the flex material 2 has the multi-layer coating 20 attached thereto. In one embodiment, slugs 16, 18 are placed into adhesive layer 6 using conventional pick and place equipment and methods.

Figure 2:
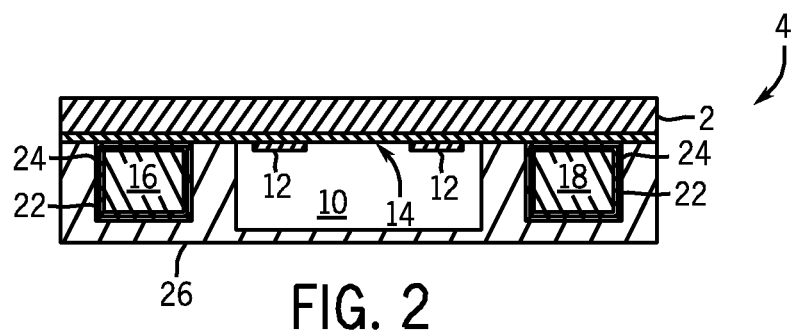
Figure 3:
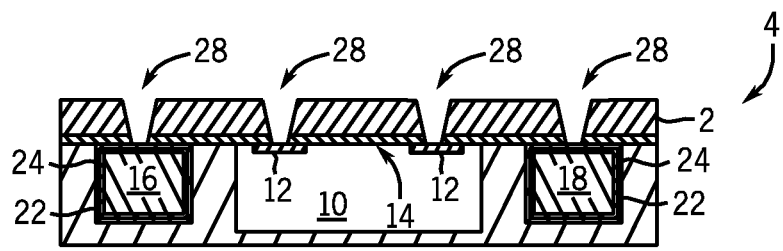

FIG. 2 shows a layer of encapsulant 26 applied to the first side 8 of flex material 2 and encapsulating die 10 and slugs 16, 18 according to an embodiment of the invention. In another embodiment, encapsulant 26 extends away from the first side 8 of flex material 2 but does not completely cover die 10 or slugs 16, 18. In one embodiment, encapsulant 26 is an epoxy. Encapsulant 26 is then allowed to cure. As shown in FIG. 3, once encapsulant 26 is cured, a plurality of vias 28 are formed through flex material 2 and adhesive 6 to expose contact pads 12 and the layer of gold 24. In one embodiment of the invention, vias 28 are formed via a laser forming process.

Figure 4:
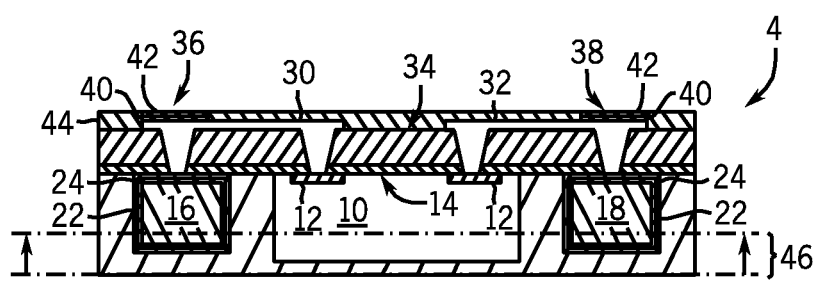

FIG. 4 shows a pair of metallization paths 30, 32 formed on a second side 34 of flex material 2 and extending through vias 28 to couple respective contact pads 12 to respective gold layers 24 of slugs 16, 18. Metallization paths 30, 32 may comprise, for example, a layer of copper coupled to a layer of titanium. A plurality of feed-thru pads 36, 38 comprising a layer of nickel 40 and a layer of gold 42 are formed or plated onto metallization paths 30, 32 using common PCB lithography processes. In one embodiment, a mask layer 44 is applied to the second side 34 of flex material 2 while leaving feed-thru pads 36, 38 exposed.

While not shown, it is contemplated that additional layers of dielectric or flex material with metallization paths may be formed for accommodating and/or re-distributing connections between contact pads 12, slugs 16, 18, and feed-thru pads 36, 38.

Referring to FIGS. 4 and 5, a portion 46 of first chip scale package layer 4 is removed via a grinding/lapping process to expose slugs 16, 18. The removed portion 46 includes portions of encapsulant 26, portions of the bulk material of die 10 if the bulk material is thicker than the desired package thickness, and a portion of slugs 16, 18 and multi-layer coating 20. As shown in FIG. 6, slugs 16, 18 and nickel layer 22 of multi-layer coating 20 are removed or expunged via an etchant (not shown) exposed thereto. Accordingly, a plurality of apertures or cavities 48, 50 are left formed in first chip scale package layer 4. The remaining layers of gold 24 in cavities 48, 50 form feed-thru pads coupled to feed-thru pads 36, 38 by metalized vias 28.

According to one embodiment as shown in FIG. 7, a plurality of stud bumps 52, 54 are affixed or coupled to feed-thru pads 36, 38, respectively, via ultrasonic welding, for example. Additionally, a solder material 56 is inserted into cavities 48, 50. Solder material 56 may be screened into cavities 48, 50 and may be a solder, a solder paste, or a conductive epoxy such as silver flakes suspended in epoxy filler.

Figure 9:
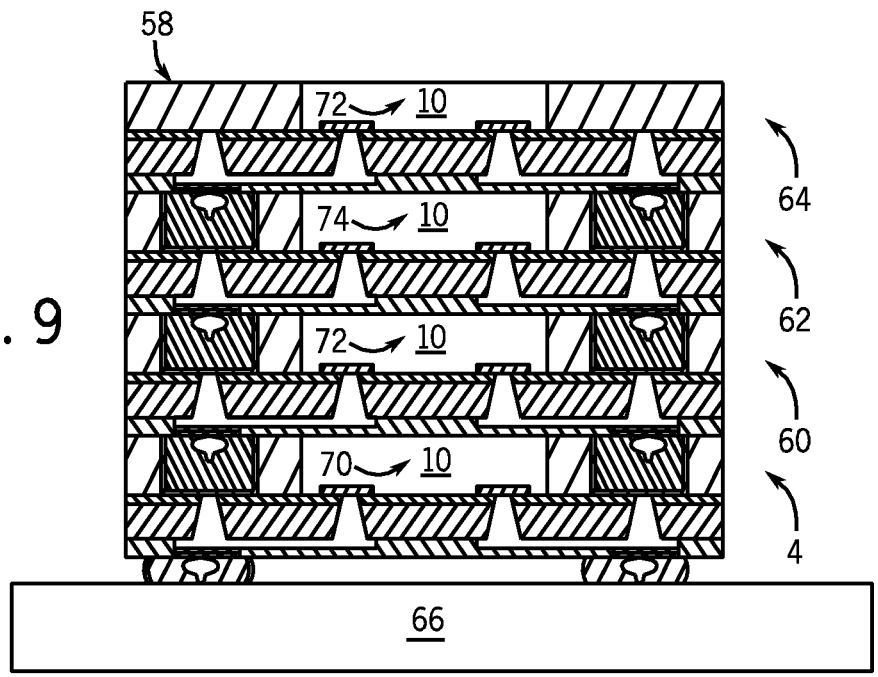
FIG. 9 is a schematic block diagram showing a multi-layer chip scale package in a first cross-sectional plane in accordance with an embodiment of the invention.

Referring to FIGS. 8 and 9, a multi-layer chip scale package 58 having second and third chip scale package layers 60, 62 formed via embodiments of the invention shown in FIGS. 1-7 is illustrated. A fourth chip scale package layer 64 is shown that does not have cavities formed in the encapsulant as described above. As shown in FIG. 9, fourth chip scale package layer 64 is a top layer of multi-layer chip scale package 58 when assembled to a component 66 such as a motherboard. Accordingly, it may not be desired to etch cavities thereinto as described above.

Chip scale package layers 4, 60, 62, and 64 are mounted or stacked one on top of the other, and the solder material 56 is reflowed and allowed to cure to couple layers 4, 60, 62, and 64 together. As shown, cavities 48, 50 allow stud bumps 52, 54 to be inserted thereinto such that an overall thickness of multi-layer chip scale package 58 is reduced.

According to an embodiment of the invention, dies 10 are all configured to perform identical tasks. For example, dies 10 may be of one die type configured to perform memory functions or processor functions. However, according to another embodiment of the invention, dies 10 are not all configured to perform identical tasks or to be of the same die type. For example, a first die type 70 may be configured to perform tasks of a first processor type, a second die type 72 may be configured to perform tasks of a second processor type, and a third die type 74 may be configured to perform tasks of a memory type as examples. Other die types are also contemplated herein.

Figure 10:
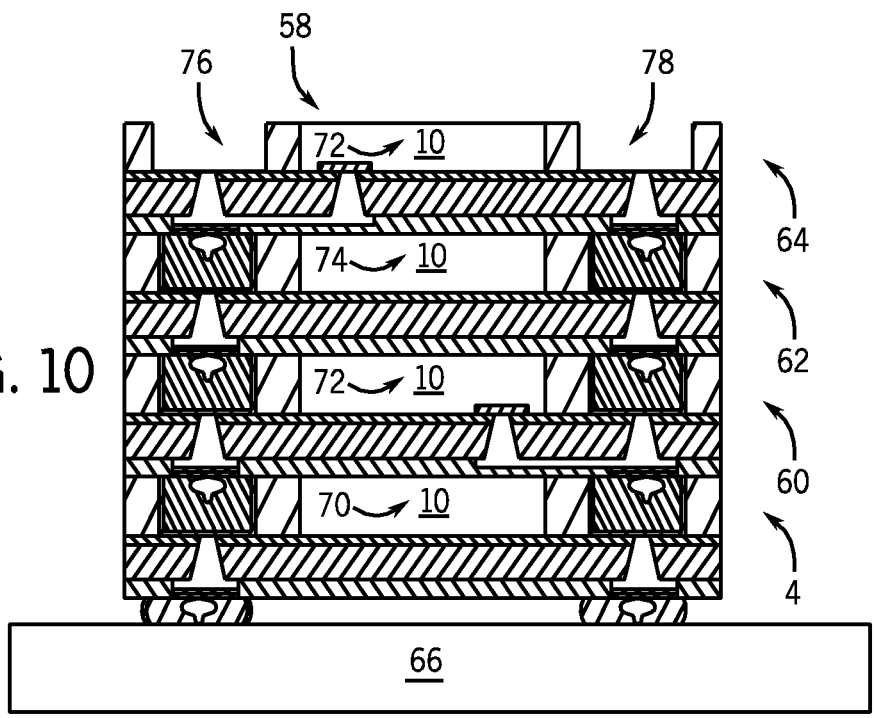
FIG. 10 is a schematic block diagram showing a multi-layer chip scale package in a second cross-sectional plane in accordance with an embodiment of the invention.

FIG. 9 illustrates a first cross-sectional plane of multi-layer chip scale package 58. As shown, feed-thru pads 36 of all layers 4, 60, 62, and 64 are coupled together, and feed-thru pads 38 of all layers 4, 60, 62, and 64 are coupled together. In this embodiment, electrical signals such as power and ground maybe respectively applied to feed-thru pads 36, 38 to provide power to dies 10. As shown in FIG. 10, a second cross-sectional plane of multi-layer chip scale package 58 allows a first electrical signal to be relayed to first die 70 of fourth chip scale package layer 64 and allows a second electrical signal to be relayed to second die 72 of second chip scale package layer 60. Additionally, while fourth chip scale package layer 64 of FIG. 9 is illustrated without having cavities formed thereinto, fourth chip scale package layer 64 of FIG. 10 has a pair of cavities 76, 78 formed thereinto according to embodiments of the invention to reduce a weight of multi-layer chip scale package 58. In another embodiment of the invention, cavities such as cavities 76, 78 may be formed in any of the chip scale package layers 4, 60, 62 to form keep-out areas or to accommodate or absorb surface-mounted components protruding from the adjoining surfaces of respective chip scale package layers 60, 62, and 64, thus reducing stacking height.

Figure 11:
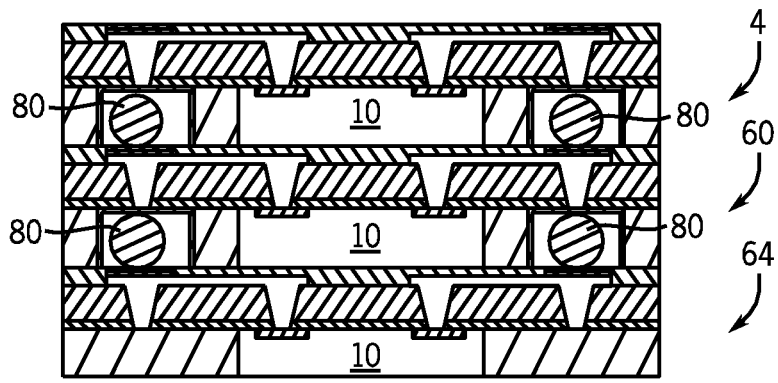
FIGS. 11-12 are schematic block diagrams showing steps of making a chip scale package incorporating in accordance with another embodiment of the invention.
Figure 12:
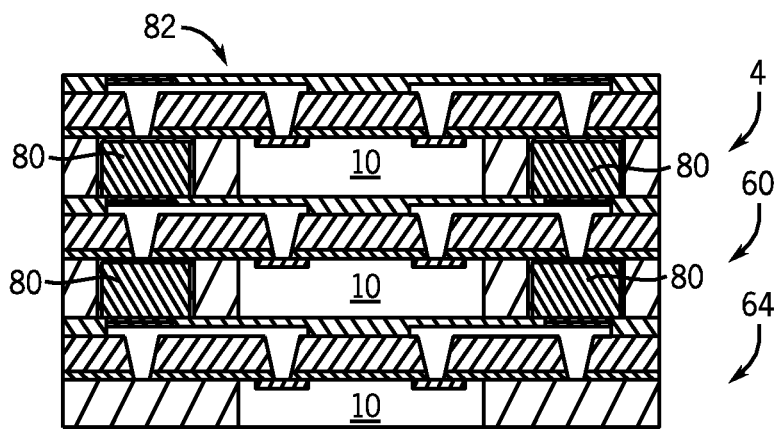

FIGS. 11 and 12 illustrates an alternative embodiment for joining chip scale package layers 4, 60, and 64 together. After forming chip scale package layers 4 and 60 as described above with respect to FIGS. 1-6, a ball of solder 80 may be placed in each of the cavities 48, 50 of layers 4, 60, and 64 as shown in FIG. 11. FIG. 12 shows a multi-layer chip scale package 82 of joined layers 4, 60, and 64 after reflowing and curing of the balls of solder 80.

Figure 13:
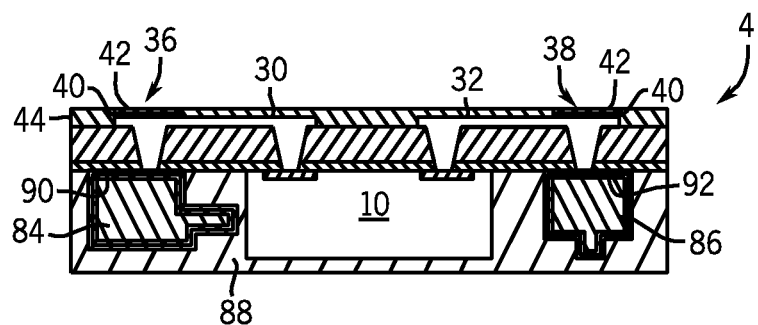
FIGS. 13-14 are schematic block diagrams showing alternately shaped slugs in accordance with another embodiment of the invention.
Figure 14:
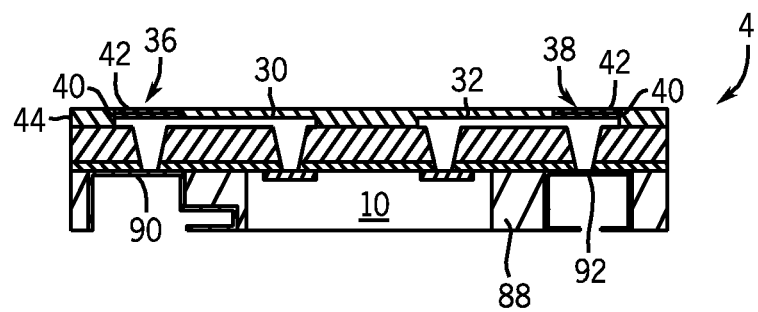

As shown in FIGS. 13 and 14, the shapes of the sacrificial slugs may vary according to the design of the cavity desired. As shown, a pair of sacrificial slugs 84, 86 having shapes different from each other are embedded into an encapsulant 88 according to an embodiment of the invention. When exposed to an etchant, sacrificial slugs 84, 86 leave behind respective gold layers 90, 92 shaped according to their respective sacrificial slugs 84, 86. In this manner, gold layers may be defined and shaped to function as electrical components such as antennas, horns, and radio frequency shields. In addition, the gold layers may be configured as a socket connector to receive a mating connector such as a pin or spring connector.

Figure 15:
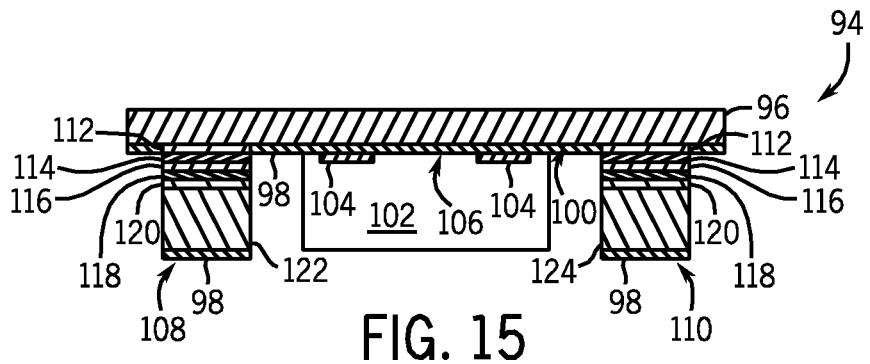
FIGS. 15-18 are schematic block diagrams showing steps of making a chip scale package incorporating in accordance with another embodiment of the invention.

FIGS. 15-18 are schematic block diagrams showing steps of making a chip scale package layer 94 in accordance with another embodiment of the invention. FIG. 15 shows a flex material 96 of chip scale package layer 94 having a plurality of multi-layer feed-thru pads 108, 110 are plated to a first side 100 of flex material 96. In one embodiment, flex material 96 is formed of a dielectric material such as Kapton. Each multi-layer feed-thru pad 108, 110 includes a titanium layer 112 deposited on the flex material 96, a copper layer 114 deposited on the titanium layer 112, a nickel layer 116 plated to the copper layer 114, a gold layer 118 plated to the nickel layer 116, and a nickel layer 120 plated to the gold layer 118. On the nickel layers 120, a slug 122, 124 is respectively plated. While FIG. 15 illustrates titanium layer 112 deposited on the flex material 96 in an embodiment of the invention, layer 112 may instead include chromium or other alloys in embodiments of the invention. In addition, while nickel, copper, and gold layers 114-120 are solderable surfaces known in the art, other commonly known solderable surfaces are also contemplated herein.

A layer of adhesive 98 is then applied to chip scale package layer 94. A die 102 having a plurality of contact pads 104 attached to an active surface 106 thereof is coupled or attached to first side 100 of flex material 96 via adhesive layer 98.

Figure 16:
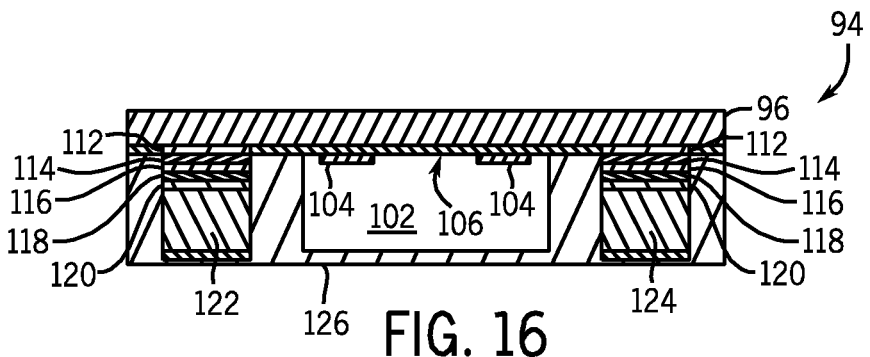
Figure 17:
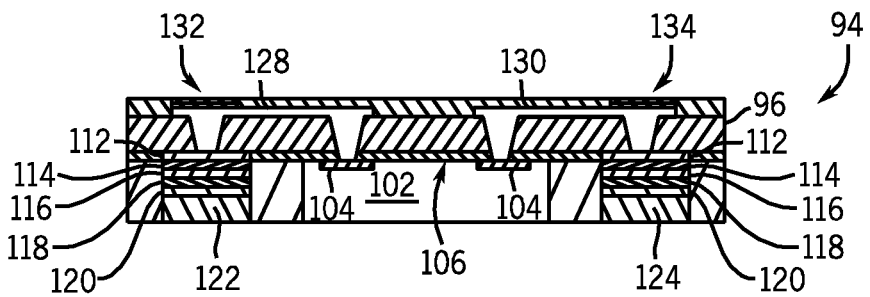
Figure 18:
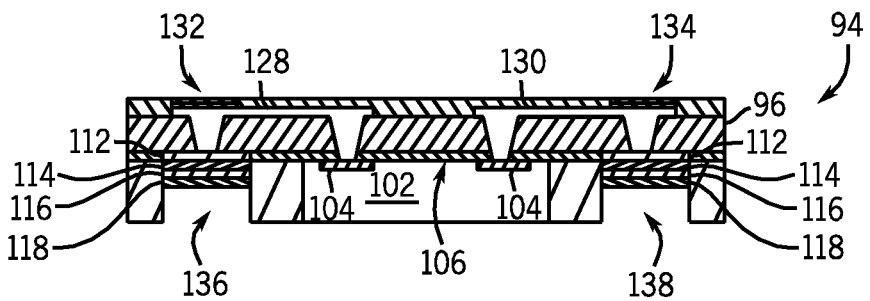

FIG. 16 shows a layer of encapsulant 126 applied to flex material 96, die 102, multi-layer feed-thru pads 108, 110, and slugs 122, 124. After the encapsulant layer 126 is cured, FIG. 17 illustrates that chip scale package layer 94 is prepared similar to that described above in FIGS. 3-5 to form metallization layers 128, 130, feed-thru pads 132, 134, and to expose slugs 122, 124. As shown in FIG. 18, exposed slugs 122, 124 and nickel layers 120 are removed or etched away, leaving gold layers 118 of multi-layer feed-thru pads 108, 110 exposed in cavities 136, 138 for coupling chip scale package layer 94 to other chip scale packages similarly formed or formed as described above in FIGS. 1-7. The remaining portions of multi-layer feed-thru pads 108, 110 form "floating" pads that are configured to flex to reduce stress on solder joints coupled thereto.

A multi-layer chip scale package according to an embodiment of the invention allows a reduction of stacked package height by allowing the cavities formed in the layers to absorb the height of the solder ball or gold bond. Furthermore, cavities may be formed according to embodiments of the invention to reduce an overall weight of the multi-layered chip scale package or to allow components of an adjacent layer to be inserted into the cavities. The formed cavities tend to have smooth and regular walls when formed according to embodiments of the invention. In addition, when solder balls are placed on opposite sides of the cavities, the substrate of the chip scale package layers acts as a "drum-head" or "floating pad" and reduces the stress of the solder joint.

In accordance with one embodiment of the invention, an apparatus comprises a first chip layer comprising a first component coupled to a first side of a first flex layer, the first component comprising a plurality of electrical pads. The first chip layer also comprises a first plurality of feed-thru pads coupled to the first side of the first flex layer and a first encapsulant encapsulating the first component, the first encapsulant having a portion thereof removed to form a first plurality of cavities in the first encapsulant and to expose the first plurality of feed-thru pads by way of the first plurality of cavities.

In accordance with another embodiment of the invention, a method comprises forming a first chip apparatus. Forming the first chip apparatus comprises coupling a first die and a first plurality of feed-thru pads to a first side of a first flex layer, the first die comprising a plurality of electrical pads; and coupling a first plurality of slugs to the first plurality of feed-thru pads. Forming the first chip apparatus also comprises encapsulating the first die, the first plurality of feed-thru pads, and the first plurality of slugs in a first encapsulant; and removing a portion of the first encapsulant to expose the first plurality of slugs. Forming the first chip apparatus further comprises removing the first plurality of slugs from the first encapsulant to form a first plurality of cavities in the first encapsulant, to expose a portion of the first plurality of feed-thru pads coupled to the first side of the first flex layer, and to reduce a rigidity of the first portion of the first plurality of feed-thru pads.

In accordance with yet another embodiment of the invention, a method comprises forming a first chip package layer that comprises coupling a first die to a first flex layer, coupling a first plurality of feed-thru pads to the first flex layer, and coupling a first plurality of sacrificial material bodies to the first plurality of feed-thru pads. Forming the first chip package layer also comprises applying a first encapsulant to the first flex layer, to the first die, to the first plurality of feed-thru pads, and to the first plurality of sacrificial material bodies. Forming the first chip package layer further comprises curing the first encapsulant, grinding a portion of the encapsulant to reveal the first plurality of sacrificial material bodies, and expunging the first plurality of sacrificial material bodies from the encapsulant to create a plurality of chambers in the encapsulant and to reveal the first plurality of feed-thru pads.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
  a first chip layer comprising:
    a first component coupled to a first side of a first flex layer, the first component comprising an electrical pad;
    a first feed-thru pad coupled to the first side of the first flex layer; and
    a first encapsulant coupled to the first side of the first flex layer, to the first component, and to the first feed-thru pad, wherein the first feed-thru pad forms a first cavity in the first encapsulant extending through the first encapsulant.

2. The apparatus of claim 1 further comprising:
  a first electrical path formed on a second side of the first flex layer; the first electrical path coupled to the electrical pad of the first component through an aperture formed through the first flex layer; and
  a second feed-thru pad coupled to a second side of the first flex layer, wherein the first and second feed-thru pads are coupled together by way of the first electrical path.

3. The apparatus of claim 2 further comprising:
  a second chip layer positioned adjacently to the first chip layer, the second chip layer comprising:
    a second component coupled to a first side of a second flex layer, the second component comprising an electrical pad;
    a second encapsulant coupled to the first side of the second flex layer and to the second component;
    a second electrical path formed on a second side of the second flex layer; the second electrical path coupled to the electrical pad of the second component through an aperture formed through the second flex layer; and
    a third feed-thru pad coupled to the second side of the second flex layer and coupled to the second electrical path; and
    a conductive material positioned within the first cavity, wherein the first and third plurality of feed-thru pads are coupled together by way of the conductive material.

4. The apparatus of claim 3 wherein the conductive material comprises one of solder, solder paste, and conductive epoxy.

5. The apparatus of claim 3 further comprising a stud bump coupled to the third feed-thru pad and extending into the first cavity.

6. The apparatus of claim 1 wherein the first feed-thru pad comprises at least one layer of electrically conductive metal.

7. The apparatus of claim 6 wherein the electrically conductive metal comprises gold.

8. The apparatus of claim 6 wherein the first plurality of feed-thru pads comprises four layers of electrically conductive metal.

9. The apparatus of claim 8 wherein the four layers of electrically conductive metal comprise titanium, copper, nickel, and gold.

10. The apparatus of claim 1 wherein the first component is one of a semiconductor die, an active electronic device, and a passive electronic device.

11. A method comprising:
  forming a first chip apparatus comprising:
    coupling a first die to a first side of a first flex layer, the first die comprising an electrical pad coupled to the first side of the first flex layer;
    coupling a first feed-thru pad to the first side of the first flex layer;
    coupling a first encapsulant to the first side of the first flex layer, to the first die, and to the first feed-thru pad, wherein the first feed-thru pad forms a first cavity in the first encapsulant extending through the first encapsulant.

12. The method of claim 11 wherein coupling the first feed-thru pad to the first side of the first flex layer comprises:
  coating a slug with an electrically conductive material; and
  coupling the electrically conductive material to the first side of the first flex layer.

13. The method of claim 12 further comprising removing the slug via an etchant.

14. The method of claim 11 wherein coupling the first feed-thru pad to the first side of the first flex layer comprises coupling a multi-layer feed-thru pad to the first side of the first flex layer, wherein each layer comprises an electrically conductive material.

15. The method of claim 14 wherein the electrically conductive material of each layer is selected from the group consisting of titanium, copper, nickel, and gold.

16. An apparatus comprising:
  a pair of flex layers;
  a first die coupled between the pair of flex layers and comprising an electrical pad thereon;
  a first encapsulant coupled between the pair of flex layers and to the first die;
  a first feed-thru pad coupled between the pair of flex layers and extending through the first encapsulant, wherein the first feed-thru pad forms a cavity in the first encapsulant;
  a first electrically conductive material positioned within the cavity; and
  a second feed-thru pad positioned between the pair of flex layers and electrically coupled to the first electrically conductive material;
  a second encapsulant coupled to one of the pair of flex layers; and a third feed-thru pad coupled to and extending through the second encapsulant, the third feed-thru pad electrically coupled to the first and second feed-thru pads.

17. The apparatus of claim 16 wherein the first feed-thru pad comprises a second electrically conductive material different from the first electrically conductive material.

18. The apparatus of claim 16 further comprising a metallization path extending from the second feed-thru pad through the one of the pair of flex layers to the third feed-thru pad.

19. The apparatus of claim 18 further comprising a second die coupled to the one of the pair of flex layers and to the second encapsulant, the second die comprising an electrical pad.

20. The apparatus of claim 19 wherein the electrical pad of the second die is electrically coupled to the metallization path.

* * * * *